United States Patent
Jiang et al.

(10) Patent No.: US 6,784,104 B2
(45) Date of Patent: Aug. 31, 2004

(54) METHOD FOR IMPROVED CU ELECTROPLATING IN INTEGRATED CIRCUIT FABRICATION

(75) Inventors: Qing-Tang Jiang, Austin, TX (US); Jiong-Ping Lu, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/194,592

(22) Filed: Jul. 12, 2002

(65) Prior Publication Data

US 2003/0022493 A1 Jan. 30, 2003

Related U.S. Application Data

(60) Provisional application No. 60/308,434, filed on Jul. 27, 2001.

(51) Int. Cl.⁷ ..................... H10L 21/4763; H01L 21/44
(52) U.S. Cl. ................. 438/687; 438/637; 438/674
(58) Field of Search .............................. 438/637–640, 438/674, 678, 687, 692; 204/489; 205/102, 123, 126

(56) References Cited

U.S. PATENT DOCUMENTS 5,143,593 A * 9/1992 Ueno et al.
5,933,758 A * 8/1999 Jain
6,024,856 A * 2/2000 Haydu et al.
6,030,693 A * 2/2000 Boyko et al.
6,103,086 A   8/2000 Woo et al.
6,103,624 A   8/2000 Nogami et al.

FOREIGN PATENT DOCUMENTS

EP   0 952 242 A1   10/1999
EP   1 152 071 A1   11/2001

* cited by examiner

Primary Examiner—Ha Tran Nguyen
(74) Attorney, Agent, or Firm—Peter K. McLarty; W. James Brady, III; Frederick J. Telecky, Jr.

(57) ABSTRACT

The electroplating of copper is the leading technology for forming copper lines on integrated circuits. In the copper electroplating process a negative potential is applied to the semiconductor wafer with the surface of the semiconductor wafer acting as the cathode. The anode will be partially or wholly formed with copper. Both the anode and the semiconductor will be exposed to a solution comprising copper electrolytes. By reducing the temperature of the copper electrolytes solution below 25° C. the rate of self annealing grain growth will increase reducing the final resistively of the copper lines.

5 Claims, 3 Drawing Sheets

METHOD FOR IMPROVED CU ELECTROPLATING IN INTEGRATED CIRCUIT FABRICATION

This application claims priority under 35 USC §119(e)(1) of provisional application Serial No. 60/308,434, filed Jul. 27, 2001.

FIELD OF THE INVENTION

The invention is generally related to the field of semiconductor devices and fabrication and more specifically to a method for forming improved copper structures.

BACKGROUND OF THE INVENTION

To increase the operating speed, high performance integrated circuits use copper interconnect technology. Currently the damascene method is the most widely used method for forming copper interconnects. Using this methodology trenches 40 are first formed in a dielectric layer 20 as shown in FIG. 1(*a*). As illustrated in FIG. 1(*a*) the dielectric layer 20 is formed over a top layer 10 which is formed over a semiconductor substrate containing numerous electronic devices such as transistors, diodes, resistors, etc. In some cases the top layer 10 is a dielectric layer. The trench 40 is typically formed using a plasma based etching process and is defined using a patterned photoresist layer 30.

Following the removal of the photoresist layer 30 a liner film 50 is formed in the trench as shown in FIG. 1(*b*). Following the formation of the liner film 50, copper is used to fill the trench resulting in the copper interconnect structure 60 shown in FIG. 1(*b*). The process used to form the copper interconnect structure 60 comprises forming a thick copper layer using a bulk copper fill process followed by chemical mechanical polishing (CMP) to remove the excess copper.

Copper electroplating has become the most widely used approach for the bulk copper fill process. However, electroplated copper is unstable after plating and will undergo grain growth transformation even at room temperature. This grain growth process is beneficial in many ways to the properties of the copper interconnects. Some of these beneficial properties include lower resistivity and better electromigration reliability. The grain growth process is very geometry dependent with smaller film geometries underoging a much slower transformation process compared to larger film geometries. A comparison of the transformation of blanket copper films is shown in FIG. 2 as a function of film thickness. The measured resistivity of the copper films is representative of the grain growth taking place in the film. As shown in FIG. 2, grain growth in thinner films takes place at a much slower rate than thicker films, indicating a slower rate of grain growth (regrowth). Shown in FIG. 3 is the percentage reduction in resistance for a 0.75 μm blanket film 80 and a copper line 90 which is 0.35 μm wide and 0.8 μm thick. The copper line 90 has a much slower rate of grain growth (regrowth or transformation) compared to the blanket film 80.

As integrated circuit technology advances, the width of the copper interconnect structures (70 in FIG. 1(*b*)) and the thickness of these structures (75 in FIG. 1(*b*)) will decrease. As this happens the electroplated copper used to form the copper interconnects will be harder to transform. It has been found that if the copper used to form these interconnect structures is not fully transformed, high resistivity and low electromigration resistance will lead to low device yield. There is therefore a need for a method which would result in fully transformed copper in damascene structures for thickness down to 0.1 μm and below.

SUMMARY OF THE INVENTION

The present invention describes an improved method for electroplating copper in integrated circuit technology. The method comprises providing a dielectric layer formed over a semiconductor wafer containing electronic devices such as transistors, capacitors etc. Copper lines are formed in the dielectric layer by first forming a trench in the dielectric layer. A barrier layer of titanium nitride or other suitable material is then formed in the trench. Before the electroplating process is performed a copper seed layer is formed on the barrier layer. With the surface of the copper seed layer acting as the cathode, the copper seed layer is placed in a electrolytic solution containing copper. An electrode is also placed in the electrolytic solution opposite the copper seed layer and a negative potential is applied to the copper seed layer while a positive potention is applied to the electrode. During the electroplating process the electrolytic solution is maintained at a temperature below about 25° C. This results is copper layers with reduced resistivity and improved stability.

DETAILED DESCRIPTION OF THE INVENTION

Figure 1A:
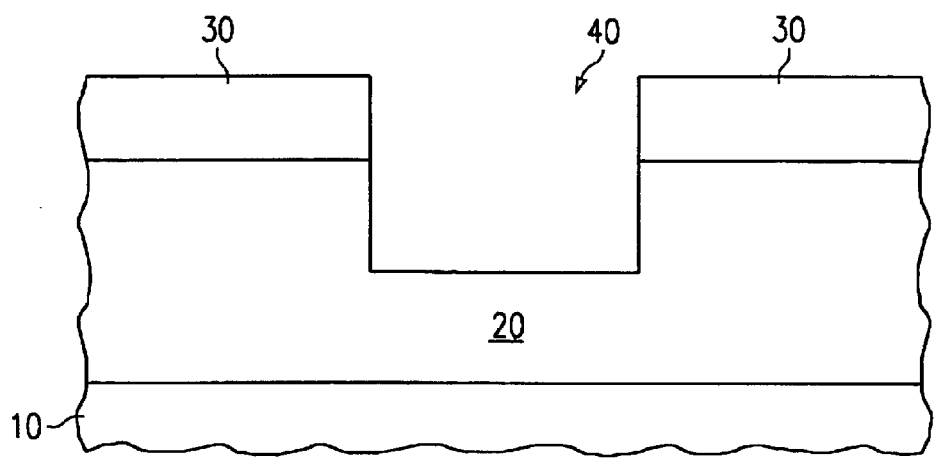
FIGS. 1(*a*)–1(*b*) are cross-sectional diagrams illustrating the formation of an integrated circuit copper interconnect structure according to the prior art.
Figure 1B:
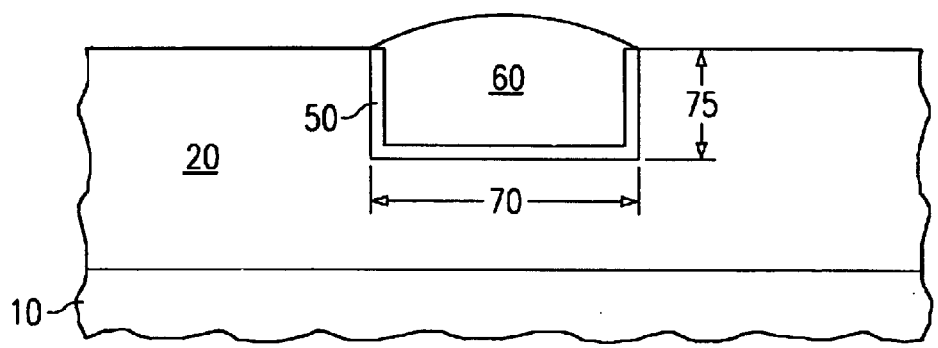
Figure 2:
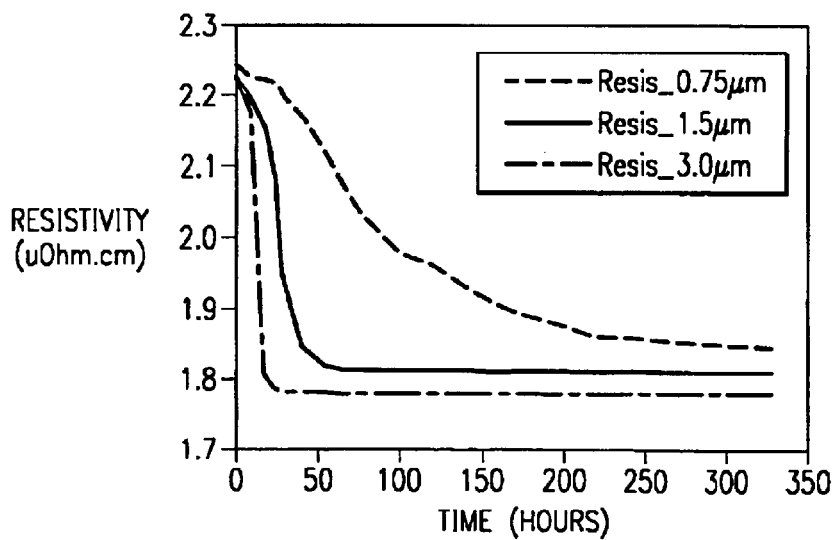
FIG. 2 shows the variation of copper film resistivity as a function of time after formation for different film thickness'.
Figure 3:
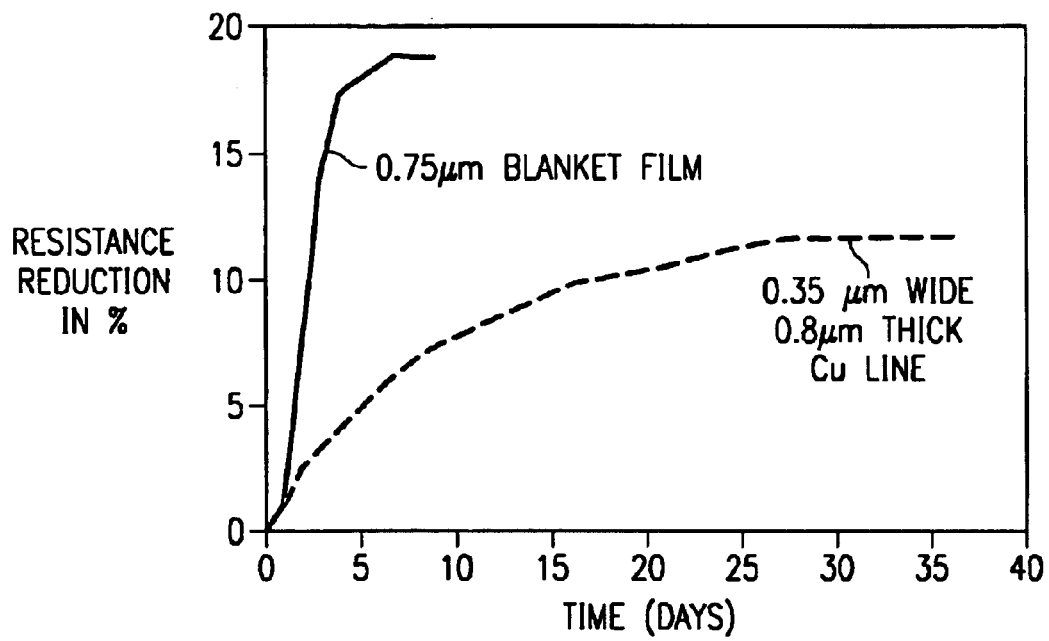
FIG. 3 shows the resistance reduction percentage of copper lines as a function of time after copper line formation for different copper line widths.
Figure 5:
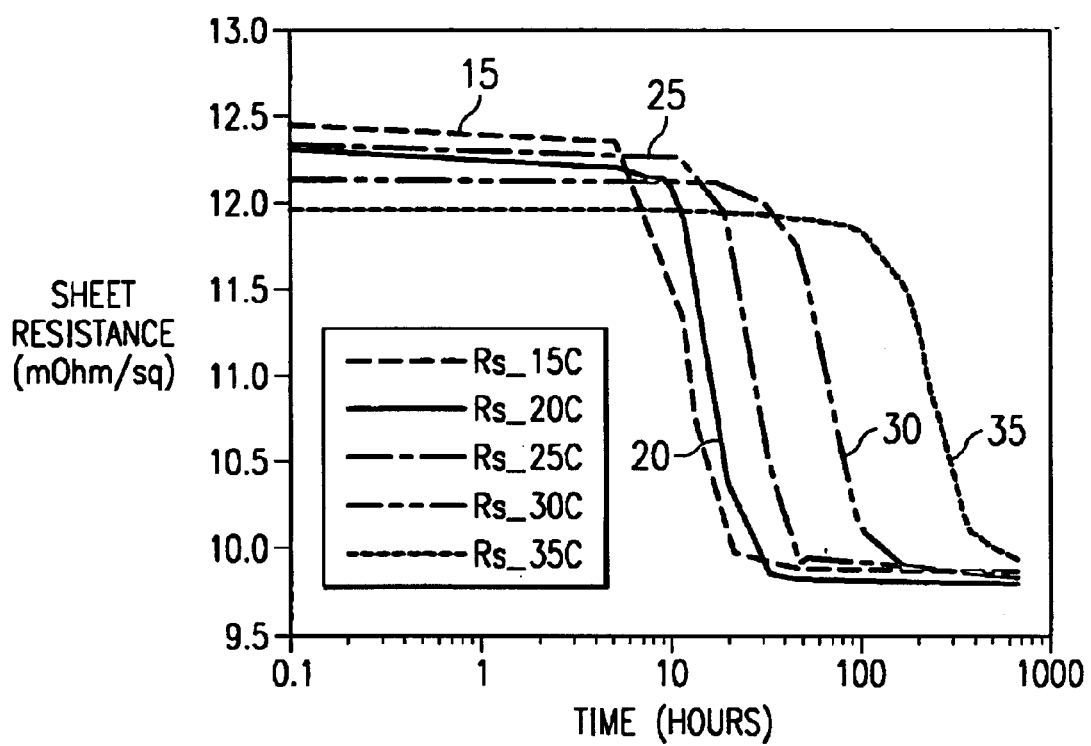
FIG. 5 shows the sheet resistance of copper films of equal thickness as a function of time after copper film formation.

The invention will now be described with reference to FIGS. 4(*a*)–4(*c*) and FIG. 5. The instant invention is suitable for use in forming copper lines less than 1.0 μm wide and a few hundred angstroms thick. It will be apparent to those of ordinary skill in the art that the benefits of the invention can be applied to other structures where the electroplating of copper is utilized.

The electroplating of copper is the leading technology for forming copper lines on integrated circuits. It offers lower cost, faster deposition, and superior copper properties compared to other known methods for copper metallization. These other methods include chemical vapor deposition (CVD), selective electroless deposition, and physical vapor deposition (PVD) or sputtering.

Electroplating comprises the electrochemical deposition of copper and is caused by the passage of electrical current between two electrodes through a copper sulfate solution, or other copper containing electrolytes. In addition to the copper electrolytes, any number of organic and non-organic additives can be added to improve the electroplating process. The electrical current to the electrode is electronic while the current in the electrolyte is ionic. At the cathode, electrochemical reduction occurs:

$$Cu^{2+} + 2e^- \rightarrow Cu,$$

whilst electrochemical oxidation occurs at the anode, usually the reverse reation, if the anode is made of copper. In this arrangement copper ions removed at the cathode are replaced by copper ions produced at the anode. Copper ions are transported to the cathode by electric drift, diffusion, and convection.

Figure 4A:
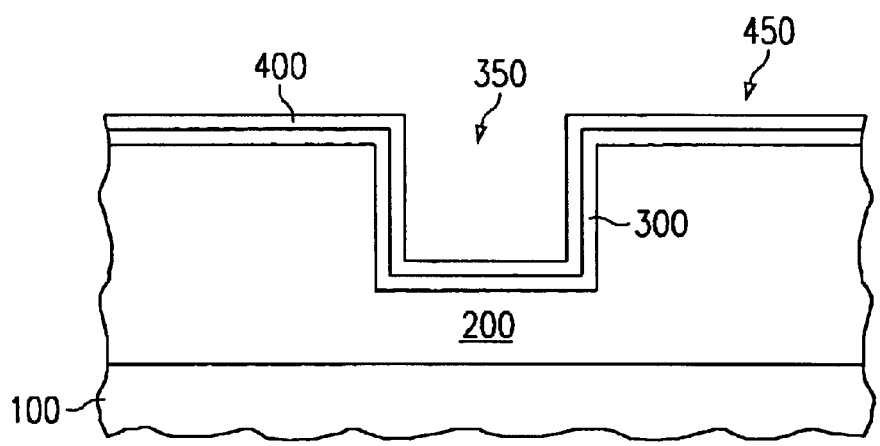
FIGS. 4(*a*)–4(*c*) are cross-sectional diagrams illustrating a typical copper electroplating process.

Shown in FIG. 4(a) is a portion of a semiconductor wafer before copper electroplating. A dielectric layer 200 is formed over a semiconductor substrate 100. Here the substrate comprises numerous electronic devices such as transistors, diodes, etc. A copper line will be formed in the dielectric layer 200 and will form part of the copper interconnect structure of the wafer. As shown in FIG. 4(a), a trench 350 is etched in the dielectric layer 200 and a barrier layer 300 is formed. In an embodiment of the instant invention this barrier layer comprises, tantalum, tantalum nitride (TaN), titanium nitride (TiN), or any suitable material. Following the formation of the barrier layer 300, a copper seed layer 400 is formed over the barrier layer 300. This copper seed layer 400 is necessary to provide good electrical contact during the electroplating process as well as good adhesion of the plated copper layer. The copper seed layer 400 is typically formed using a CVD or PVD metallization process.

Figure 4B:
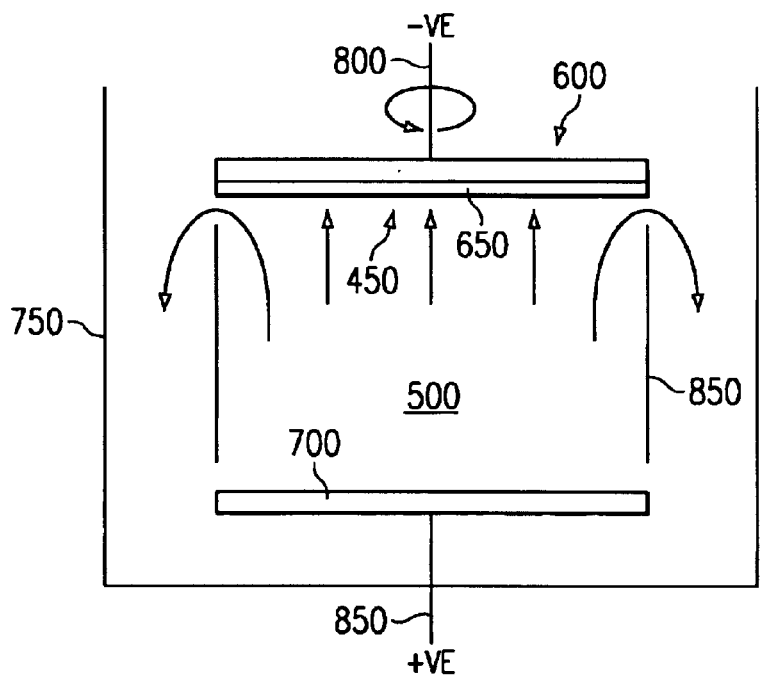
Figure 4C:
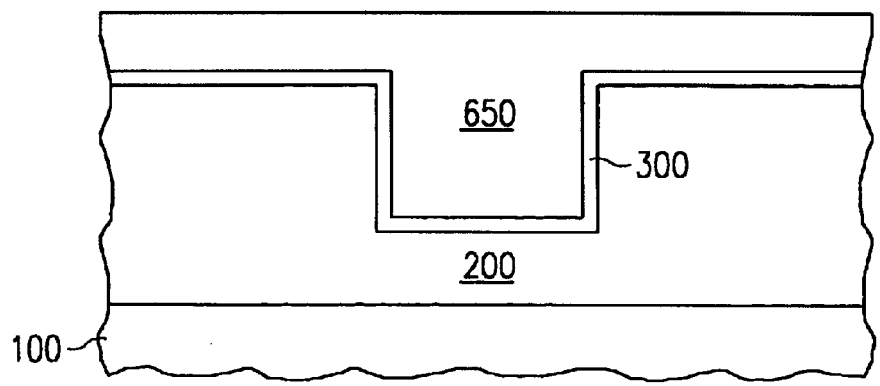

Shown in FIG. 4(b) is a simplified diagram of an electrochemical copper plating apparatus. The silicon wafer 600 acts as the cathode and a negative potential 800 is applied to the surface of the wafer 450. The wafer surface 450 shown in FIG. 4(a) is exposed to the copper electrolytic solution 500. In an embodiment of the instant invention the copper electrolytic solution 500 comprises copper sulfate. The anode comprises a copper plate 700 to which a positive voltage is applied. It should be noted that the exact arrangement of the anode, cathode, and copper electrolytic solution will vary. FIG. 4(b) is therefore intended to illustrate just the basic properties of all electrochemical copper plating systems. These basic properties are that the surface of the wafer will act as the cathode, the anode will be partially or wholly formed with copper, and both the anode and the cathode will be exposed to a solution comprising copper electrolytes. In the embodiment shown in FIG. 4(b), the copper electrolyte solution 500 flows from the anode 700 to the cathode 600 causing a copper layer 650 to form on the surface 450 of the wafer 600. The electrolyte solution 500 is usually contained and re-circulated in a vessel 750. In some applications the wafer 600 is rotated during the electroplating process. Shown in FIG. 4(c) is the structure of FIG. 4(a) after the copper electroplating process. The copper layer 650 is shown in FIG. 4(c) to have completely filled the trench. Following the formation of the copper layer, chemical mechanical polishing (CMP) is used to remove the excess copper from the surface of the wafer.

Currently, the electrochemical copper process described above is performed at room temperature. This leads to the geometric dependence of the grain growth phenomena described above. In an embodiment of the instant invention, by performing the electrochemical copper process at temperatures below that of room temperature, the geometric dependence of the rate of grain growth (or transformation) can be reduced and/or eliminated. This is illustrated in FIG. 5, which shows a series of self annealing curves of copper films electroplated at different temperatures. The copper films used to produce the curves shown in FIG. 5 where blanket films of equal thickness. The sheet resistance of these blanket copper films were measured at room temperature as a function of sit-time or time after formation. As shown in FIG. 5 all the films converged to the same sheet resistance value indicating that the initial film thickness were similar. FIG. 5 clearly shows that as the temperature of the electroplating process is reduced below that of room temperature, the time over which the sheet resistance of the films decrease to their minimum value decreases. This reduction in sheet resistance is indicative of grain growth taking place in the copper films. It should be noted that room temperature in the instant invention refers to approximately 25° C. Therefore, by reducing the temperature at which the electroplating process takes place below 25° C., the rate of self annealing grain growth in the copper films increases. The temperature of the electroplating process can be controlled below 25° C. by ensuring that the solution containing the copper electrolytes, the electrodes (i.e. anode and cathode) and the vessel containing the copper electrolyte solution are all maintained below 25° C., such as at 15° C. or 10° C.

Following the electroplating process the grain growth in the copper layers can be enhanced by thermal annealing. In an embodiment of the instant invention, the copper layers formed by electroplating at temperatures below 25° C. are thermally annealed by raising the temperature of the copper films above 25° C. for a predetermined length of time. This thermal annealing can be performed using a conventional furnace or using a rapid thermal processing (RTP) system. The RTP system provides the added advantage of rapidly heating and cooling the copper films thereby reducing the buildup of internal stress in the films.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method for forming copper interconnects, comprising:
   providing a dielectric layer formed over a semiconductor wafer wherein electronic devices have been formed in said semiconductor wafer;
   forming a trench in said dielectric layer;
   forming a barrier layer in said trench;
   forming a copper seed layer on said barrier layer;
   placing said copper seed layer in a electrolytic solution containing copper;
   placing an electrode in said electrolytic solution oppositely positioned from said copper seed layer;
   simultaneously applying a negative potential to said copper seed layer and a positive voltage to said electrode such that a copper layer is formed on said copper seed layer by electroplating; and
   maintaining said electrolytic solution at temperatures below 20° C. during said copper layer formation.

2. The method of claim 1 wherein said electrode comprises copper.

3. The method of claim 1 further comprising thermally annealing said copper layer at temperatures above room temperature.

4. The method of claim 1 further comprising removing a portion of said copper layer using chemical mechanical polishing.

5. The method of claim 1 wherein said electrolytic solution is maintained at a temperature in the range of 10–15° C.

* * * * *